(12) United States Patent
Tezuka et al.

(10) Patent No.: US 6,713,779 B2
(45) Date of Patent: Mar. 30, 2004

(54) SEMICONDUCTOR DEVICE AND METHOD OF MANUFACTURING THE SAME

(75) Inventors: Tsutomu Tezuka, Kanagawa-ken (JP); Shinichi Takagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/029,022

(22) Filed: Dec. 28, 2001

(65) Prior Publication Data

US 2002/0088971 A1 Jul. 11, 2002

(30) Foreign Application Priority Data

Dec. 28, 2000 (JP) ........................................ 2000-402669

(51) Int. Cl.$^7$ .............................................. H01L 29/72
(52) U.S. Cl. ..................... 257/19; 257/190; 257/192; 257/194; 257/195; 257/351; 257/616
(58) Field of Search ..................... 257/19, 190, 192, 257/194, 195, 616, 351

(56) References Cited

U.S. PATENT DOCUMENTS 5,847,419 A * 12/1998 Imai et al. .................. 257/192

FOREIGN PATENT DOCUMENTS

JP 2000-243946 9/2000

OTHER PUBLICATIONS

Takagi, S., "Semiconductor Device", U.S. Ser. No.: 09/665,682, filed: Sep. 20, 2000, Specification—38 pages, and 3 sheets of drawings.

Sugiyama, N. et al., "Semiconductor Device and Method for Manufacturing the Same", U.S. Ser. No.: 09/468,923, filed: Dec. 22, 1999, Specification—39 pages, and 3 sheets of drawings.

Tezuka, T., et al. "A Novel Fabrication Technique of Ultrathin and Relaxed SiGe Buffer Layers with High Ge Fraction for Sub–100 nm Strained Silicon–on Insulator MOSFETS", Jpn. J. App. Phys. vol. 40, Part 1, No. 4B, pp. 2866–2874, (Apr. 2001).

Tezuka, T., et al. "A Novel Fabrication Technique of Ultra–thin and Relaxed SiGe Buffer Layers with High Ge Content for sub–100 nm Strained Silicon–on–Insulator MOSFETS", Advanced LSI Technology Laboratory, Corporate R&D Center, Toshiba Corporation, 2 pages, Aug. 29, 2000.

* cited by examiner

Primary Examiner—Edward Wojciechowicz
(74) Attorney, Agent, or Firm—Finnegan, Henderson, Farabow, Garrett & Dunner, L.L.P.

(57) ABSTRACT

An object of the invention is to provide a complete depletion-mode SOI field-effect transistor in which transistors having different threshold voltages are integrated. A SiGe film having a high Ge composition and a SiGe film having a low Ge composition are formed on an insulating film, and strain-Si films are respectively formed thereon. Transistors including channel regions in the strain-Si films obtained as a result of this are formed, so that the transistors having different threshold voltages can be integrated.

16 Claims, 11 Drawing Sheets

SEMICONDUCTOR DEVICE AND METHOD OF MANUFACTURING THE SAME

DESCRIPTION OF THE INVENTION

CROSS-REFERENCE TO A RELATED APPLICATION

This application is based upon and claims the benefit of priority from the prior Japanese Patent Application No. 2000-402669, filed on Dec. 28, 2000, the entire contents of which are incorporated herein by reference.

1. Field of the Invention

The present invention relates to a semiconductor device and a method of manufacturing the same.

2. Background of the Invention

In recent years, the electric power consumed by large-scale integrated circuits (LSI) has risen steadily as the integration density of transistors and the operating frequency has increased. The consumed electric power of a high-end processor already exceeds 100 watts.

In order to suppress the consumed electric power of such LSIs, it is effective to lower the power supply voltage of each transistor.

On the other hand, in order to improve the driving power of a transistor while the power supply voltage is low, a threshold voltage of each transistor must also be lower. However, if the threshold voltage of a transistor is set low, the off current is higher and consumed electric power during the time of waiting is increased.

It is expected that this effect becomes remarkable in situations in which the gate length of a transistor is shorter than 100 nm, that is, in a situation in which a power supply voltage is 1 V and a threshold voltage is no higher than 0.3 V.

One method for solving the problem of electrical power consumption during the waiting period relies on a method in which two kinds of transistors, a transistor having a high threshold voltage and a transistor having a low threshold voltage, are integrated on one LSI chip. In this method, the low threshold voltage transistor, is minute and can operate at high speeds, but has a large off current. The low threshold voltage transistor is used for a principal CMOS logic circuit portion. On the other hand, the high threshold voltage transistor is superior in cut off characteristics and may be used for cutting off a leakage current of a transistor in the CMOS circuit at an off time.

Also, in an LSI with an analog CMOS circuit and a digital CMOS circuit integrated on one chip, it is necessary to integrate transistors having different threshold voltages because the sizes of transistors and power supply voltages in the digital and the analog portions are different from each other.

Transistors having different threshold voltages are conventionally integrated on bulk silicon by changing an impurity concentration of a well. The potential of a substrate is grounded and fixed in the bulk silicon, so that a difference between the work function of a metal used for a gate electrode and the potential of a semiconductor is altered by changing the impurity concentration of the well. As a result, the threshold voltage can be controlled.

In the future, as transistors become smaller and the degree of integration increases, field-effect transistors using an SOI (Silicon On Insulator) substrate, which greatly lowers contact capacitance, will be more commonly used. Among the field-effect transistors using SOI substrates, a complete depletion-mode field-effect transistor is most attractive. This is because a depletion layer reaches a buried insulating film of the SOI substrate at a time of operation that can suppress a short channel effect and perform a transistor operation even if a gate length becomes 100 nm or less.

However, the complete depletion-mode field-effect transistor does have at least one problem. Since a portion of the buried insulating film of the SOI substrate is completely depleted, the body cannot be grounded, and the threshold cannot be controlled by changing the concentration of an impurity. This is because the body is not grounded so that the difference between the work function of a metal used for a gate electrode and the potential of a semiconductor cannot be easily changed even if an impurity is changed. Therefore, the threshold is difficult to control.

As described above, there has been a demand for integration of a plurality of field-effect transistors having different threshold voltages. This integration has traditionally been achieved by controlling the threshold voltages of the field-effect transistors. However, the complete depletion-mode field-effect transistor, which has the advantage of greatly lowering the contact capacitance, has a problem in that integration cannot be achieved by controlling different threshold voltages.

SUMMARY OF THE INVENTION

The present invention has been made to solve the above problems, and provides a semiconductor device in which transistors having different threshold voltages can be integrated on one LSI chip, and a method of manufacturing the same.

According to a first aspect of the invention, a semiconductor device comprises: a first lattice-relaxed $Si_{1-x}Ge_x$ film formed on a first region on an insulating film, wherein a Ge composition x is in a range of 0 to 1; a second lattice-relaxed SiGe film having a Ge composition greater than the first lattice-relaxed $Si_{1-x}Ge_x$ film, wherein the second lattice-relaxed SiGe film is formed on a second region on the insulating film; a first strain-Si film formed on the first lattice-relaxed $Si_{1-x}Ge_x$ film; a second strain-Si film formed on the second lattice-relaxed SiGe film; a complete depletion-mode first field-effect transistor including the first strain-Si film as a channel; and a complete depletion-mode second field-effect transistor including the second strain-Si film as a channel, threshold value of the second field-effect transistor is different from threshold value of the first field-effect transistor.

According to a second aspect of the invention, a semiconductor device comprises: a substrate; an insulating film; a first field-effect transistor including a first lattice-relaxed $Si_{1-x}Ge_x$ film having a Ge composition x in a range of 0 to 1 and formed in a first region on the insulating film, a first strain-Si film formed on the first lattice-relaxed $Si_{1-x}Ge_x$ film, a first gate insulating film formed on the first strain-Si film, a first gate electrode formed on the first gate insulating film, and a first source region and a first drain region separately formed in the first strain-Si film; and a second field-effect transistor including a second lattice-relaxed SiGe film formed in a second region on the insulating film, a second strain-Si film formed on the second lattice-relaxed SiGe film, a second gate insulating film formed on the second strain-Si film, a second gate electrode formed on the second gate insulating film, and a second source region and a second drain region separately formed in the second strain-Si film, wherein a threshold voltage of the second field-effect transistor is different from a threshold voltage of the first field-effect transistor.

According to a third aspect of the invention, a method of manufacturing a semiconductor device comprising: forming a first SiGe film and a second SiGe film having different thickness on an insulating film; forming a first lattice-relaxed SiGe film and a second lattice-relaxed SiGe film having different Ge compositions by oxidizing the first SiGe film and the second SiGe film from surfaces; forming a strain-Si film on the first lattice-relaxed SiGe film and the second lattice-relaxed SiGe film; forming a gate insulating film on the strain-Si film; and forming a gate electrode on the gate insulating film.

According to a fourth aspect of the invention, a method of manufacturing a semiconductor device comprising: forming an SiGe film on an insulating film; forming a mask having an opening portion on the SiGe film; oxidizing a top surface of the SiGe film under the opening portion of the mask to form a first lattice-relaxed SiGe film under the mask and a second lattice-relaxed SiGe film under the opening portion of the mask simultaneously, wherein a Ge composition of the first lattice-relaxed SiGe film and a Ge composition of the second lattice-relaxed SiGe film are different; removing the mask; forming a strain-Si film on the first lattice-relaxed SiGe film and the second lattice-relaxed SiGe film; forming a gate insulating film on the strain-Si film; and forming a gate electrode on the gate insulating film.

DESCRIPTION OF THE EMBODIMENTS

Hereinafter, preferred embodiments of the present invention will be described with reference to the drawings.

First Embodiment

Figure 1:
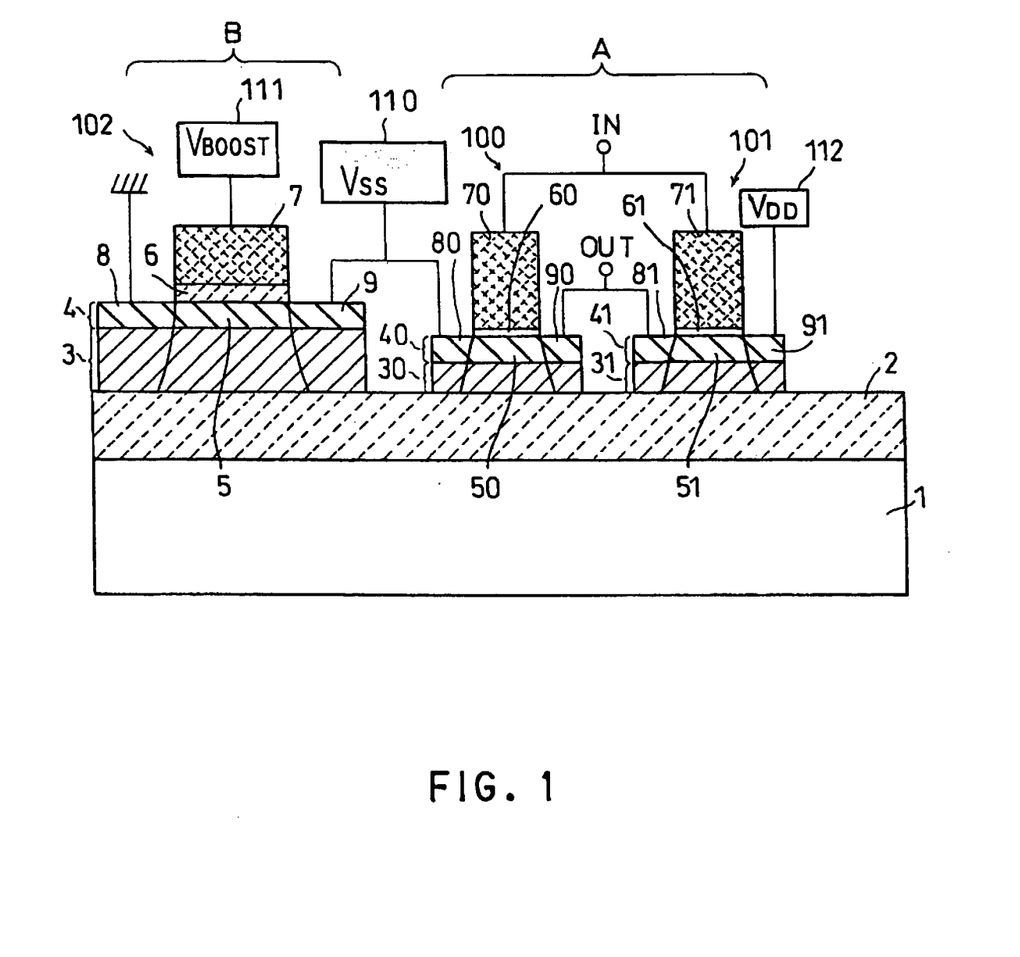
FIG. 1 is a sectional view of a semiconductor device of a first embodiment of the present invention.

FIG. 1 is a sectional view of a semiconductor device of a first embodiment of the present invention comprising a complementary field-effect transistor having a transistor in which a p-channel region is formed in a strain-Si film and a transistor in which an n-channel region is formed in a strain-Si film, and a leak cutting field-effect transistor having a high threshold voltage and connected to the complementary field-effect transistor.

In the semiconductor device shown in FIG. 1, a buried insulating film 2 made of silicon oxide is formed on a silicon substrate 1 having a (001) plane as a principal plane. A high-speed logic portion A comprises a complementary field-effect transistor formed on the buried insulating film 2. The complementary field-effect transistor has an n-type field-effect transistor 100 having a low threshold voltage and a p-type field-effect transistor 101 having a low threshold voltage.

Also, an n-type field-effect transistor 102 having a threshold voltage higher than the n-type field-effect transistor 100 is formed on the buried insulating film 2. A drain region 9 of the n-type field-effect transistor 102 is connected to a source region 80 of the n-type field-effect transistor 100, and a wiring line. A voltage $V_{SS}$ 110 is applied to the wiring line. The n-type field-effect transistor 102 functions as a leak cut switch portion B which is turned off to prevent a leak current from flowing in a period when the high speed logic portion A is in a waiting state. In FIG. 1, a source region 8 of the transistor 102 is grounded, and a power supply voltage $V_{DD}$ 112 is applied to a drain region 91 of the transistor 101. A gate electrode 7 of the leak cutting field-effect transistor 102 is connected to a boost voltage $V_{Boost}$ applying unit 111.

The leak cutting field-effect transistor 102 comprises a lattice-relaxed $Si_{0.84}Ge_{0.16}$ film 3 formed on the buried insulating film 2, a strain-Si film 4 formed on the lattice-relaxed SiGe film 3, a gate insulating film 6 comprised of $SiO_2$ formed on the strain-Si film 4, the gate electrode 7 comprised of tungsten formed on the gate insulating film 6, a channel region 5 formed in the strain-Si film 4 under the gate insulating film 6, and the source region 8 and the drain region 9 separately formed in the strain-Si film 4 and provided in a manner that the channel region 5 is positioned between them.

The n-type field-effect transistor 100, which is part of the complementary field-effect transistor, comprises a lattice-relaxed $Si_{0.6}Ge_{0.4}$ film 30 formed on the buried insulating film 2, a strain-Si film 40 formed on the lattice-relaxed SiGe film 30, a gate insulating film 60 comprised of $SiO_2$ formed on the strain-Si film 40, a gate electrode 70 comprised of tungsten formed on the gate insulating film 60, a channel region 50 formed in the strain-Si film 40 under the gate insulating film 60, and the source region 80 and a drain region 90 separately formed in the strain-Si film 40 and provided in a manner that the channel region 50 is positioned between them.

The p-type field-effect transistor 101, which is part of the complementary field-effect transistor, comprises a lattice-relaxed $Si_{0.6}Ge_{0.4}$ film 31 formed on the buried insulating film 2, a strain-Si film 41 formed on the lattice-relaxed SiGe film 31, a gate insulating film 61 comprised of $SiO_2$ formed on the strain-Si film 41, a gate electrode 71 comprised of tungsten formed on the gate insulating film 61, a channel region 51 formed in the strain-Si film 41 under the gate insulating film 61, and a source region 91 and the drain region 91 separately formed in the strain-Si film 41 and provided in such a manner that the channel region 51 is positioned between them.

Transistors 100, 101, and 102 have a so-called SOI structure. Additionally, transistors 100, 101, and 102 may be complete depletion-mode field-effect transistors. Voltages $V_{SS}$ 110, $V_{DD}$ 112, and $V_{Boost}$ 111 are $0 \leq V_{SS} \leq V_{DD} < V_{Boost}$. In transistor 102, the thickness of the lattice-relaxed SiGe film 3 is 50 nm. In transistors 100 and 101, the thickness of each of the lattice-relaxed SiGe films 30 and 31 is 10 nm. The thickness of each of the strain-Si films 4, 40, and 41 is 5 nm. N-type impurities are diffused in the source regions 8 and 80 and the drain regions 9 and 90 of the leak cutting field-effect transistor 102 and the n-type field-effect transistor 100. The diffusion range includes not only the strain-Si films 4 and 40 but also the lattice-relaxed SiGe films 3 and 30. P-type impurities are diffused in the source region 81 and the drain region 91 of the p-type field-effect transistor 101. The diffusion range includes not only the strain-Si film 41 but also the lattice-relaxed SiGe film 31.

In the semiconductor device shown in FIG. 1, the Ge concentration in the lattice-relaxed SiGe film 3 of the leak cutting field-effect transistor 102 is lower than the Ge concentration of each of the lattice-relaxed SiGe films 30 and 31 of the transistors 100 and 101. Accordingly, the strain amount of the strain-Si film 4 is smaller than that of each of the strain-Si films 40 and 41. In this case, the threshold voltage of the leak cutting field-effect transistor 102 is higher than that of each of the transistors 100 and 101. Thus, a Ge composition x of the lattice-relaxed SiGe film 3 can be arbitrarily selected as long as it is lower than a Ge composition y of each of the lattice-relaxed SiGe films 30 and 31.

The energy of the ground level (Ec) of the conductor band of the n-type MOSFET, 102, including the strain-Si film 4 as the channel region 5, changes according to $\Delta Ec = -0.5x$, where x is the Ge composition of the $Si_{1-x}Ge_x$ film 3 and $0 \leq x \leq 1$. Accordingly, in order to change a threshold value of the MOSFET 102 of an ideal S parameter (S=60 mV/decade) by one digit, it is necessary to change the Ge composition x by at least 0.12. To obtain the change of the threshold value of one digit by the lowest x, the Ge composition x of the $Si_{1-x}Ge_x$ ($0 \leq x \leq 1$) film 3 is made 0, and the Ge composition of the SiGe film 30 of the region A is made 12 atomic %.

On the other hand, it is preferable to have the Ge composition of each of the SiGe films 30 and 31 of the region A 25 atomic % or higher. This is because, as the Ge composition becomes large, the mobility of an electron or a hole in the strain-Si film is increased and the driving force is increased. For example, the rate of increase of charge mobility is saturated when the Ge composition is 15 atomic % in the case where an electron is a carrier, or about 25 atomic % in the case where a hole is a carrier. Therefore, if the Ge composition is 25 atomic % or higher, the maximum mobility can be obtained in both the p-channel MOSFET 101 and the n-channel MOSFET 100. Additionally, it is preferable that a difference between the Ge composition of the SiGe film 3 of the region B and the Ge composition of each of the SiGe films 30 and 31 of the region A is 12 atomic % or higher.

Figure 8:
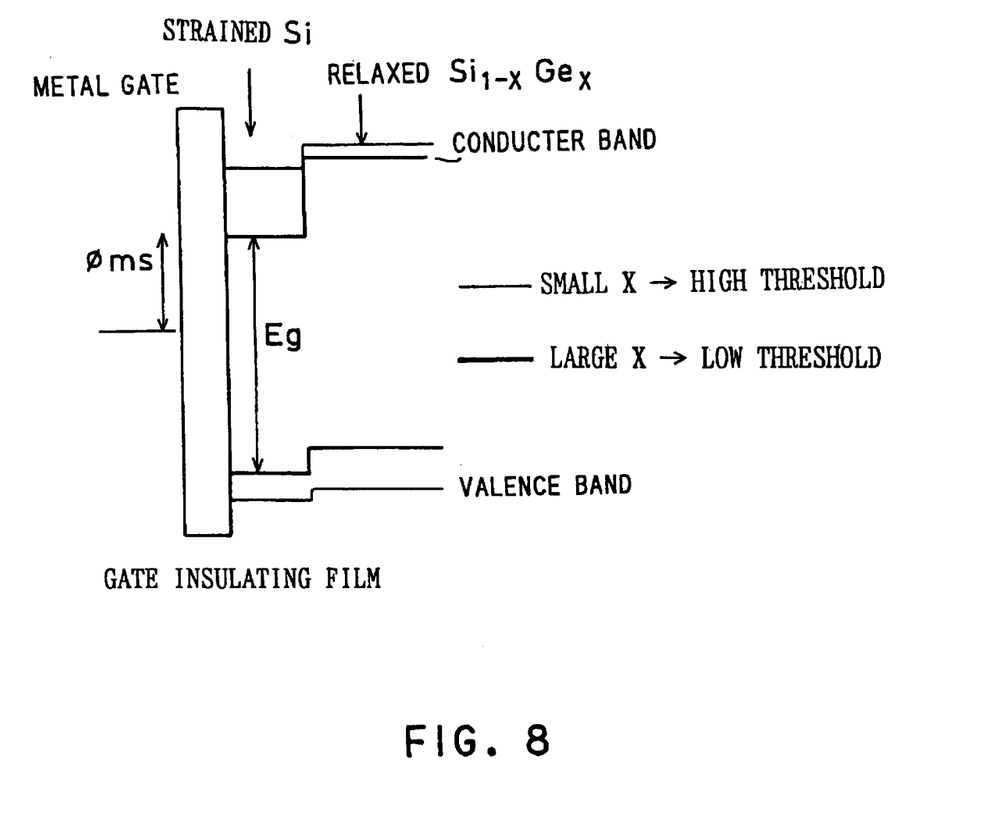
FIG. 8 is a band diagram of a channel region in a p-channel MOSFET of the semiconductor device of a third embodiment of the present invention.
Figure 9:
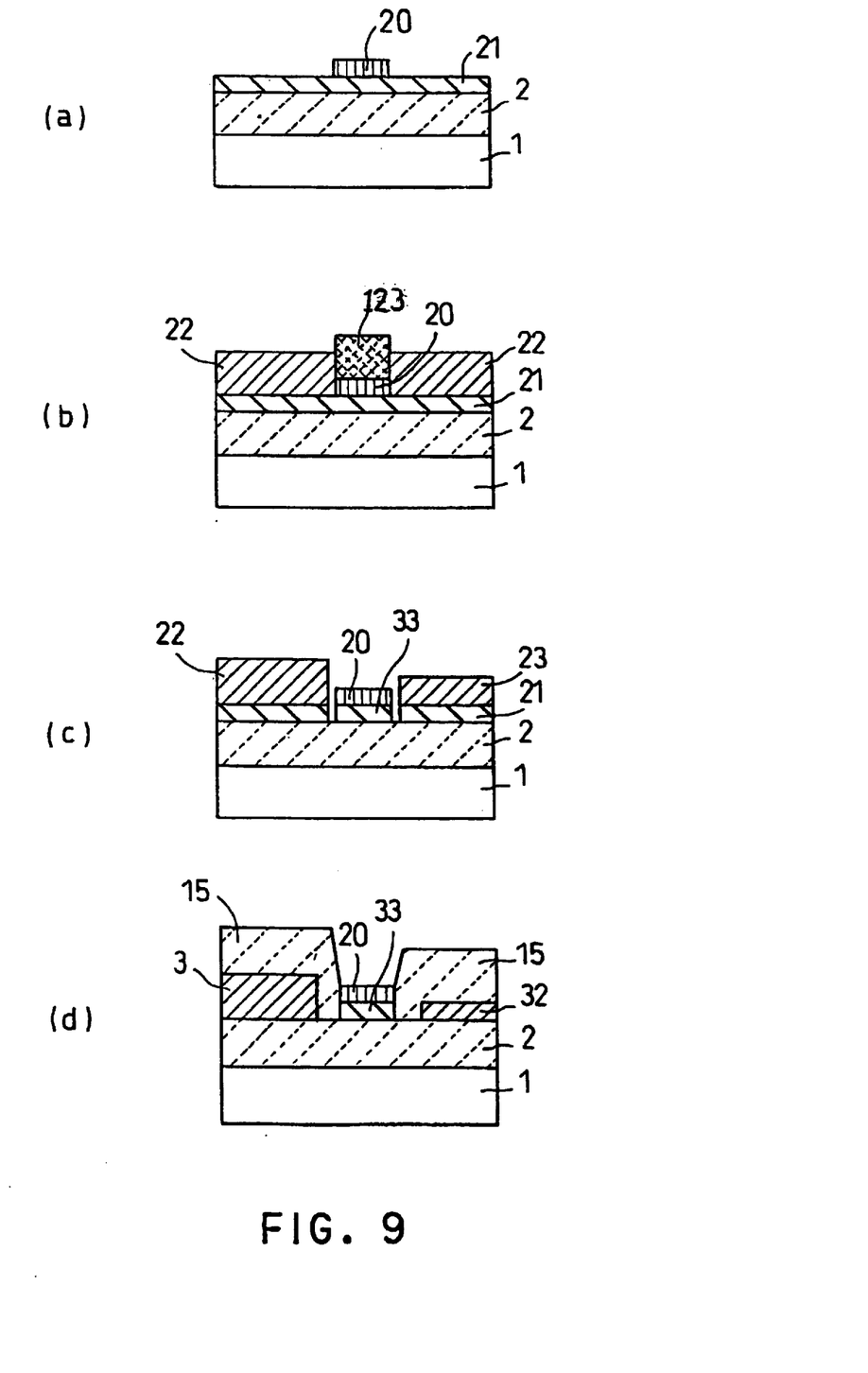
FIGS. 9A to 9D are sectional views of respective manufacturing steps of the semiconductor device of a third embodiment of the present invention.
Figure 10:
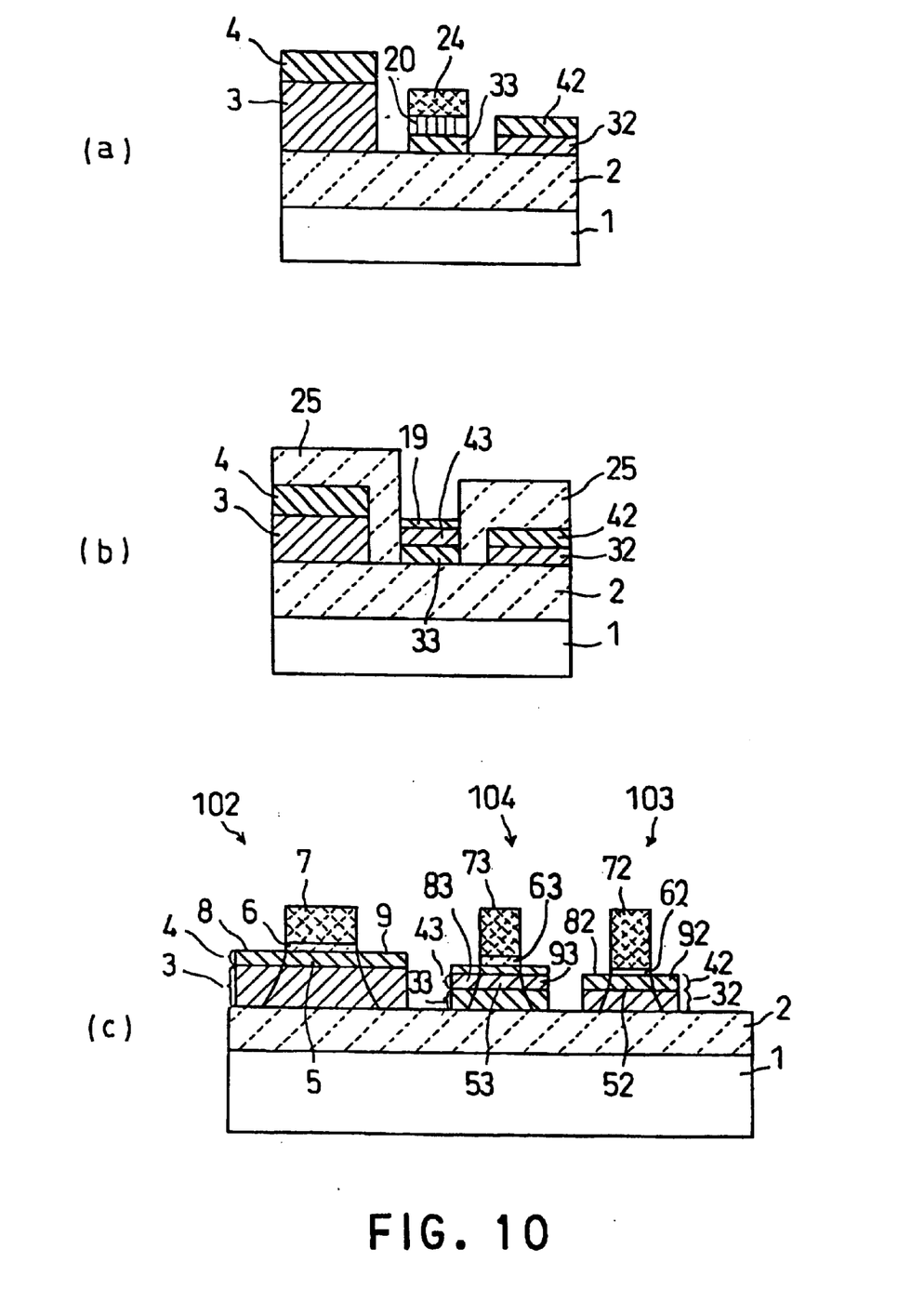
FIGS. 10A to 10C are sectional views of respective manufacturing steps of the semiconductor device of a third embodiment of the present invention.

FIG. 8 is a band diagram of the channel portion of the MOSFET 100, 101 in the CMOS of this embodiment.

As shown in FIG. 8, when the Ge composition of the SiGe film is increased in the strain Si-MOSFET, since φms and Eg-φms are decreased, the absolute value of the threshold voltage is decreased in both the p-channel MOSFET 101 and the n-channel MOSFET 100. Here, Eg is a band gap of strain Si, φms is a difference between the work function of the gate electrode and the electron affinity of the strain Si. However, the dependency of the threshold voltage on the Ge composition (or strain amount of the strain Si) of the SiGe film in the n-channel MOSFET 100 is larger than that in the p-channel MOSFET 101.

Alternatively, the first embodiment may be modified in the following ways. First, the gate electrodes 7, 70, and 71 may be comprised of high melting metal other than tungsten such as molybdenum, tantalum, polysilicon, polysilicon germanium or a laminate structure of any of these and silicide such as $TiSi_2$, $CoSi_2$, NiSi. Further, in view of an excellent operation as the CMOS, it is appropriate that the absolute values of the threshold values of the p-channel MOSFET 101 and the n-channel MOSFET 100 are made equal to each other. Thus, in the p-channel MOSFET 101 and the n-channel MOSFET 100, the compositions of the SiGe films 30, 31 may be made different from each other. Preferably, the Ge composition of the SiGe film 31 of the p-channel MOSFET 101 is set to be higher than the Ge composition of the SiGe film 30 of the n-channel MOSFET 100.

In the complete depletion-mode field-effect transistor, the transistors 100 and 101, each of which has a low threshold voltage, is minute, and can perform high speed operations, but has a large off current, are used for the principal CMOS logic circuit portion A. Transistor 102, on the other hand, which has the high threshold voltage and has excellent in the cut off characteristics, can be used as the leak cutting transistor.

Next, a method of manufacturing the semiconductor device shown in FIG. 1 will be described by reference to FIGS. 2A and 3C.

Figure 2:
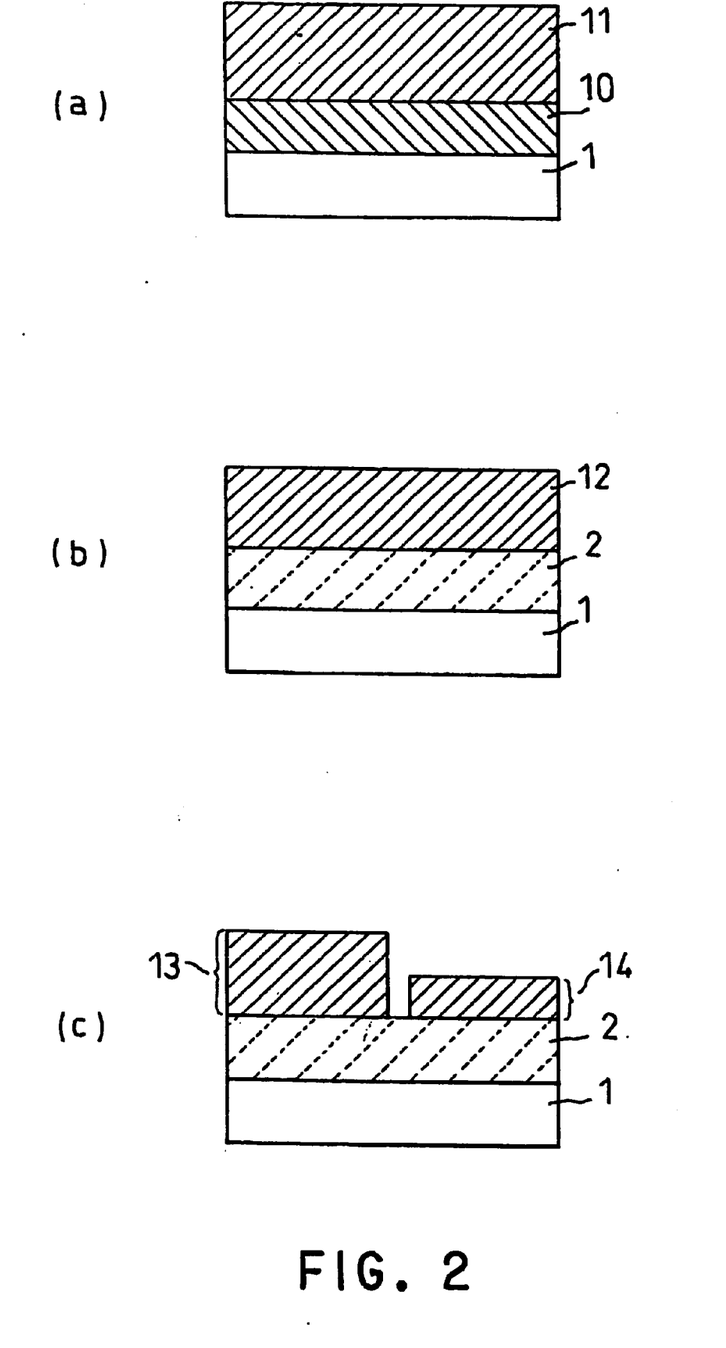
FIGS. 2A to 2C are sectional views of respective manufacturing steps of the semiconductor device of a first embodiment of the present invention.

First, as shown in FIG. 2A, an inclined composition SiGe layer 10 is formed on a silicon substrate 1 having a (100) plane as a principal plane, using epitaxial growth by a CVD or MBE method. During the formation of the inclined composition $Si_{1-x}Gex$ layer 10, the flow rate of a Ge raw material gas is adjusted so that the Ge composition x is gradually changed from 0 at the surface of the silicon substrate 1 to 0.1 at the surface of the SiGe layer 10. Next, a $Si_{0.9}Ge_{0.1}$ layer 11 is formed on the inclined composition SiGe layer 10 by a similar process.

Next, an oxygen ion is implanted into the surface of the $Si_{0.9}Ge_{0.1}$ layer 11 using an ion implantation apparatus and an ion implantation energy of 160 keV and a dosage of $4 \times 10^{17}$ cm$^{-2}$. The entire structure shown in FIG. 2A is subjected to a heat treatment at 1350° C. for six hours. The heat treatment causes the Ge atoms in the inclined composition SiGe layer 10 shown in FIG. 2A to diffuse into the Si substrate 1. As shown in FIG. 2B, a buried insulating film 2 comprised of $SiO_2$ having a thickness of 100 nm, and a lattice-relaxed SiGe layer 12 having a thickness of 300 nm are formed.

Next, the lattice-relaxed SiGe layer 12 is thinned to a thickness of 80 nm by chemical dry etching. Then a part of the lattice-relaxed SiGe layer 12 is protected by a mask, and a part of the lattice-relaxed SiGe film layer 12 is thinned further by the chemical dry etching. In this way, as shown in FIG. 2C, a thick lattice-relaxed SiGe film 13 with a thickness of 80 nm and a thin lattice-relaxed SiGe film 14 with a thickness of 50 nm are formed. Further, the thick lattice-relaxed SiGe film 13 and the thin lattice-relaxed SiGe film 14 are separated by a photolithography step. By these steps, the first SiGe film 13 and the second SiGe film 14 having different thickness are formed on the insulating film 2.

Next, the structure shown in FIG. 2C is subjected to a dry thermal oxidation treatment at 1100° C. By this oxidation step, the thick SiGe film 13 and the thin SiGe film 14 are oxidized from the surfaces, so that an $SiO_2$ film 15 is formed over the SiGe films 13 and 14. This treatment causes the Si atoms in both SiGe films 13 and 14 to bond to oxygen atoms, while Ge atoms are expelled from the oxide film and stored in remaining portions of the SiGe films 13 and 14. As a result, the SiGe films 3 and 30, shown in FIG. 3A, have different Ge compositions.

Since the buried insulating film 2 prevents Ge atoms from diffusing into the silicon substrate 1, as the oxidation proceeds, the Ge compositions in the thick SiGe film 3 and the thin SiGe film 30 become large. Also, the interfaces between the buried insulating film 2 and the SiGe films 3 and 30 become weak at temperatures of 1000° C. or higher. Accordingly, the change of the lattice constant due to the rise in the Ge composition does not effect the lattice-relaxed state of the SiGe films 3 and 30.

Referring again to FIG. 2C, the thick SiGe film 13 and the thin SiGe film 14 are simultaneously lattice-relaxed by the SIMOX step at the time of the formation of the buried insulating film 2. Alternatively, an SOI substrate could be previously acquired, and the thick SiGe film 13 and the thin SiGe film 14 having different thickness may be formed by epitaxial growth. In that case, the first SiGe film 13 and the second SiGe film 14 are in a strained state and are lattice-relaxed at the same time, during the oxidation step.

When the thickness of the SiGe film before the oxidation is T1 (FIG. 2C), and the thickness of the SiGe film after the oxidation is T2 (FIG. 3A), the Ge composition after the oxidation becomes T1/T2 times as large as that before the oxidation. Accordingly, when the Ge composition before the oxidation is x ($0 \leq x \leq 1$), the thickness of the thick SiGe film 3 is Ti, the thickness of the thin SiGe film 30 is Ti-$\Delta$ (where $\Delta$ is the difference in height), the thickness consumed by the oxidation is Tc in both the SiGe films 3 and 30, the Ge compositions of the thick SiGe film 3 and the thin SiGe film 30 after the oxidation are xa ($0 \leq xa \leq 1$) and xb ($0 \leq xb \leq 1$), respectively, then xa=x{Ti/(Ti−Tc)}, xb=x {Ti−$\Delta$)/(Ti−$\Delta$−Tc)}.

Then, since xb/xa={1−($\Delta$/Ti)}/[1−$\Delta$/(Ti−Tc)}]>1, the Ge composition of the thin SiGe film 30 becomes larger than that of the SiGe film 3.

Applying these principles to this described embodiment, the thickness of the thick SiGe film 3 is thinned from 80 nm to 50 nm, and the thickness of the thin SiGe film 30 is thinned from 40 nm to 10 nm by oxidation. As a result, the thick SiGe film 3 has a Ge composition of 16 atomic % and the thin SiGe film 30 has a Ge composition of 40 atomic %.

Figure 3:
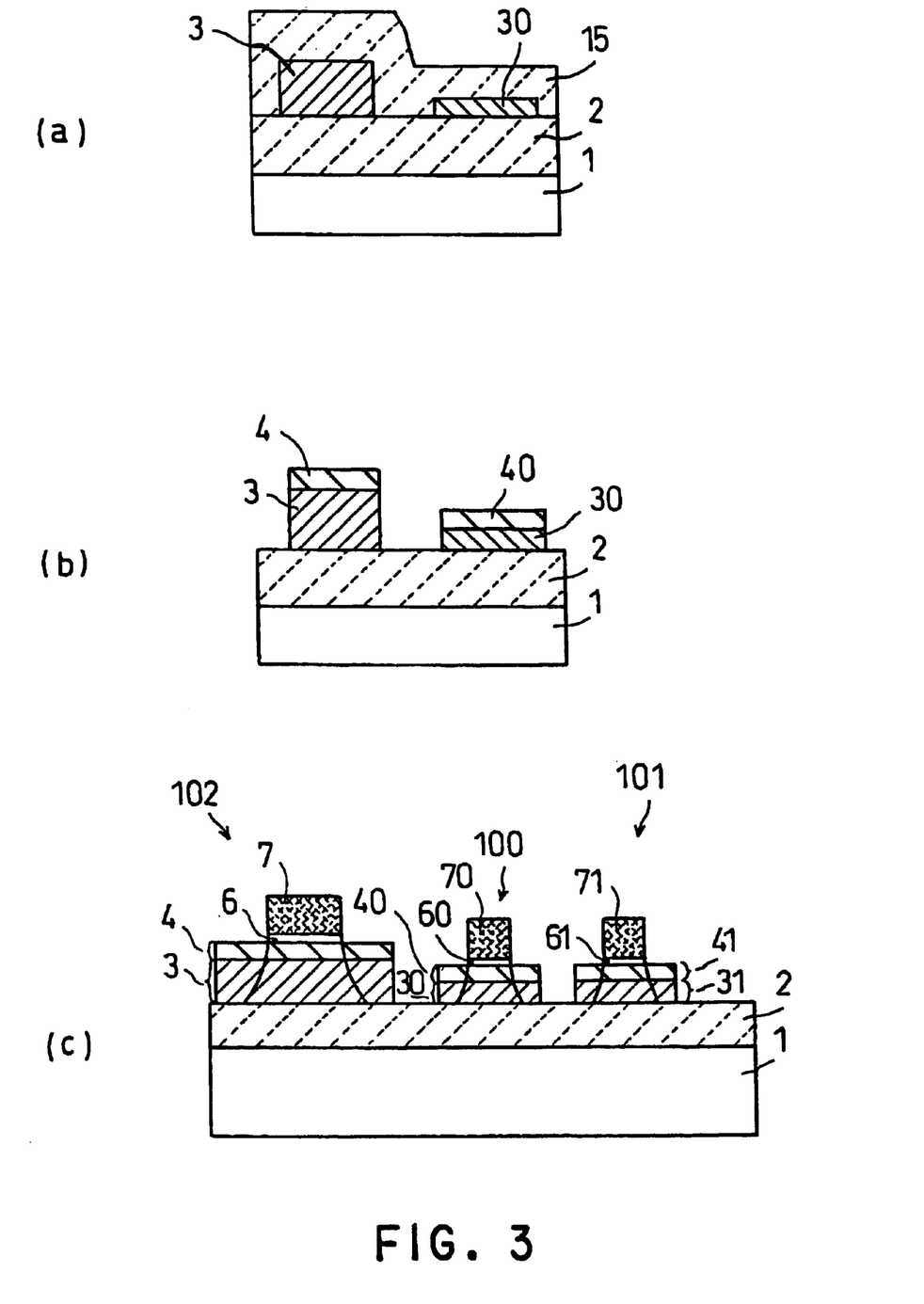
FIGS. 3A to 3C are sectional views of respective manufacturing steps of the semiconductor device of a first embodiment of the present invention.
Figure 4:
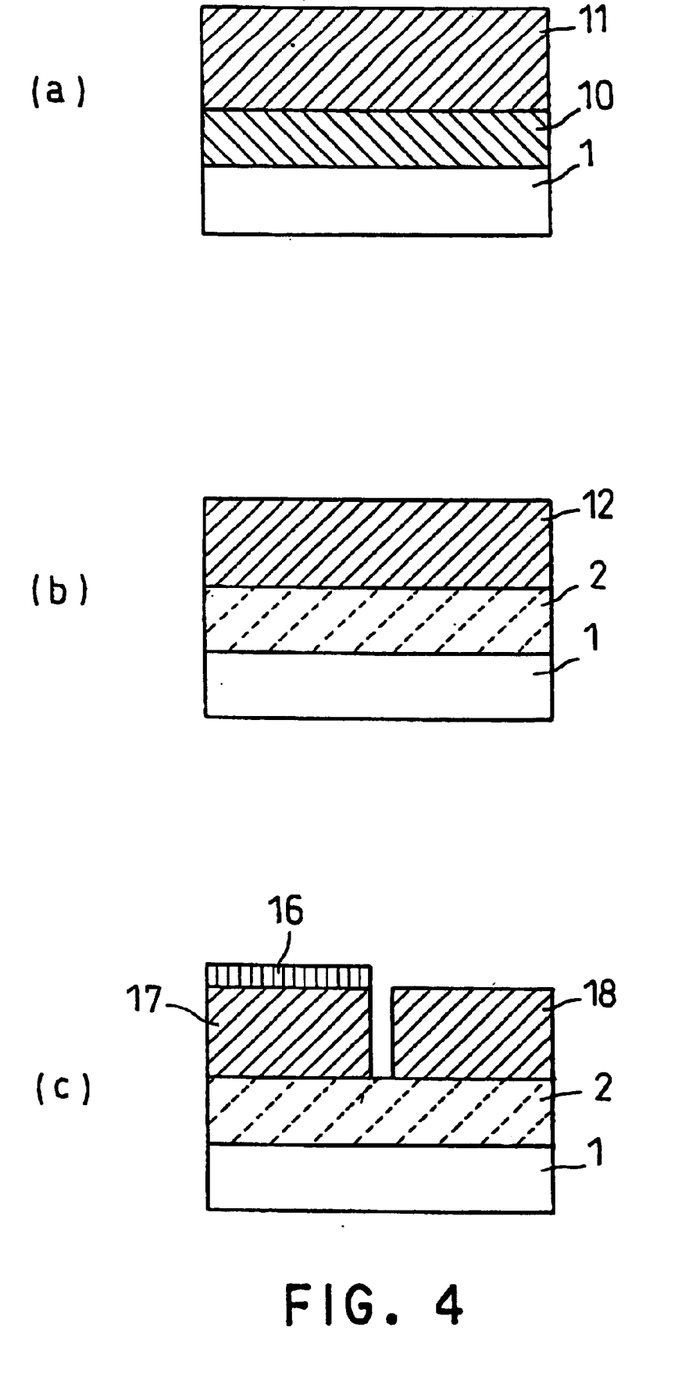
FIGS. 4A to 4C are sectional views of respective manufacturing steps of a semiconductor device of a second embodiment of the present invention.
Figure 5:
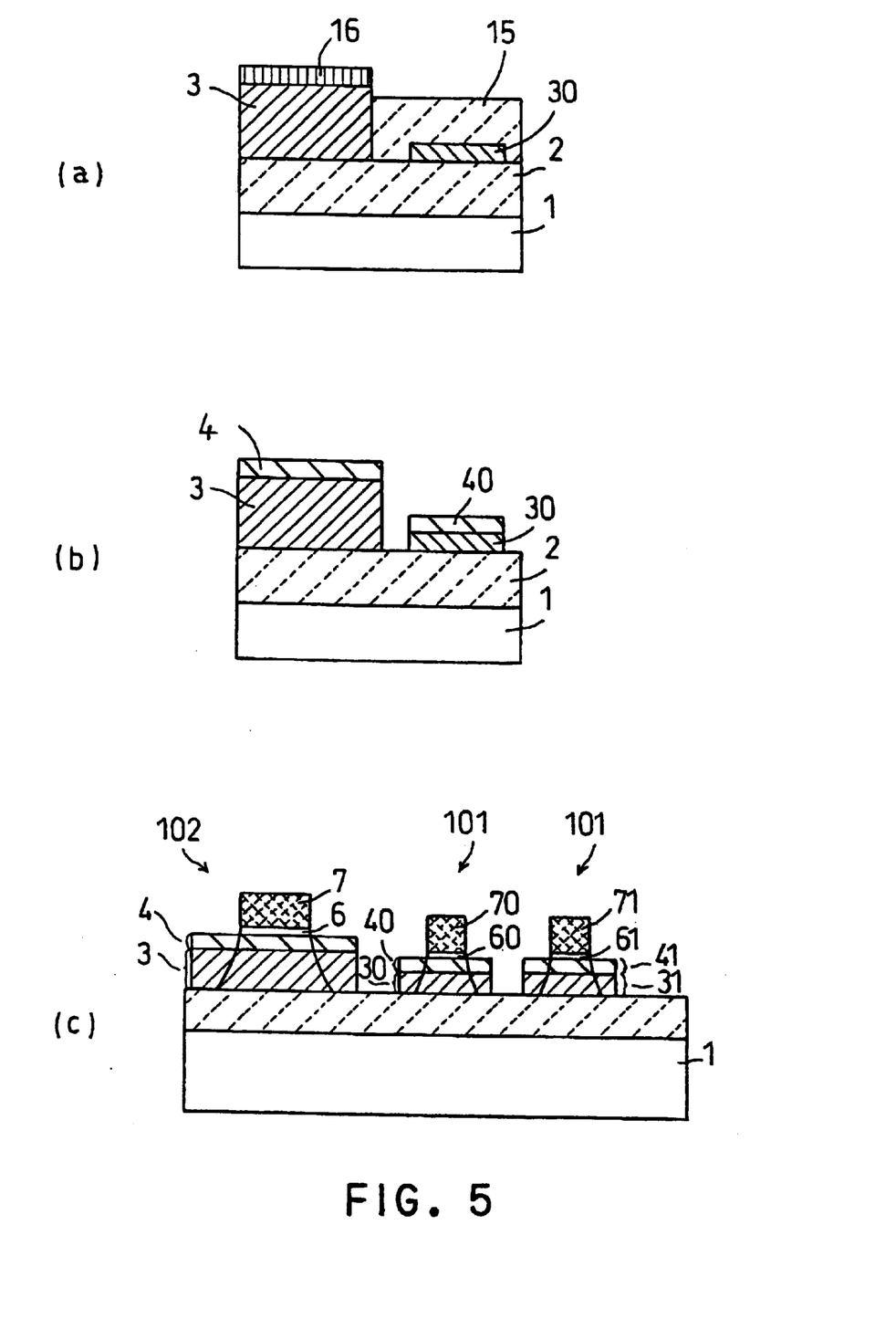
FIGS. 5A to 5C are sectional views of respective manufacturing steps of the semiconductor device of a second embodiment of the present invention.

Next, as shown in FIG. 3B, the oxide film 15 formed in FIG. 3A is peeled off by hydrofluoric acid, and strain-Si films 4 and 42 are epitaxially grown on the lattice-relaxed SiGe films 3 and 30, respectively, by a CVD method or the like. By doing so, the strain-Si films 4 and 40 are applied with different strains corresponding to the lattice constants of the thick lattice-relaxed SiGe film 3 and the thin lattice-relaxed SiGe film 30 respectively.

Next, as shown in FIG. 3C, gate insulating films 6 and 60 are formed on the strain-Si films 4 and 40, and gate electrodes 7 and 70 are formed on the gate insulating films 6 and 60. Additional transistors such as transistor 101 may be also be formed during the steps of the manufacturing method described above. Wiring lines and connections to voltages $V_{SS}$ 110, $V_{DD}$ 112, and $V_{Boost}$ 111 and to a ground are supplied to form the semiconductor device shown in FIG. 1.

Second Embodiment

An alternative method of manufacturing the semiconductor device shown in FIG. 1 will be described by use of FIGS. 4A to 5C.

First, as shown in FIG. 4A, an inclined composition SiGe layer 10 is formed on a silicon substrate 1 having a (100) plane as a principal plane using epitaxial growth by a chemical vapor deposition (CVD) or molecular beam epitaxy (MBE) method. During the formation of the inclined composition $Si_{1-x}Ge_x$, layer 10, the flow rate of a Ge raw material gas is adjusted so that a Ge composition x is gradually changed from 0 at the surface of the silicon substrate 1 to 0.1 at the surface of the SiGe layer. Next, a $Si_{0.9}Ge_{0.1}$ layer 11 is formed on the inclined composition SiGe layer 10 by a similar process.

Next, an oxygen ion is implanted into the surface of the $Si_{0.9}Ge_{0.1}$ layer 11 using an ion implantation apparatus and an ion implantation energy of 160 keV and a dosage of $4\times10^{17}$ cm$^{-2}$. The structure shown in FIG. 4A is subjected to a heat treatment at 1350° C. for six hours. As a result of the heat treatment, a buried oxide film 2 comprised of $SiO_2$ having a thickness of 100 nm and a lattice relaxed SiGe layer 12 having a thickness of 300 nm are formed.

Next, the lattice-relaxed SiGe layer 12 is thinned to a thickness of 80 nm by chemical dry etching. Then, as shown in FIG. 4C, a mask 16 made of $Si_3N_4$ and having an opening portion is formed on the substrate. Further, a region 17 of the SiGe film in which the mask 16 is formed is separated from a region 18 of the SiGe film which is exposed at the opening portion of the mask 16.

Next, the structure shown in FIG. 4C is subjected to a dry thermal oxidation treatment at 1100° C. The SiGe film 18 exposed at the opening portion is oxidized from the surface to form a thin film and to increase the Ge composition. In this oxidation step, the SiGe film 18 is oxidized from the surface, so that a $SiO_2$ film 15 is formed over the SiGe film 18. This process causes the Si atoms in the SiGe film 18 to bond to oxygen atoms, while Ge atoms are expelled from the oxide film and stored in the remaining portion of the SiGe film 18. In this way, as shown in FIG. 5A, a thick SiGe film 3 positioned under the mask and a thin SiGe film 30 positioned at the opening portion of the mask 16, which have different Ge compositions, are formed at the same time. The Ge composition of the thick SiGe film 3 is 0.1 and its thickness is 80 nm, and the Ge composition of the thin SiGe film 30 is 0.4 and its thickness is 20 nm.

Since the buried insulating film 2 prevents Ge atoms from diffusing into the silicon substrate 1, as the oxidation proceeds the Ge composition in the SiGe film 30 becomes large. In addition, the interface between the buried insulating film 2 and the SiGe film 30 becomes weak at temperatures of 1000° C. or higher. Accordingly, the strain resulting from the change of a lattice constant due to the rise in the Ge composition does not affect the lattice-relaxed state of the SiGe film 30. In this way, the oxidation step causes the SiGe films 3 and 30 shown in FIG. 5A to have different Ge compositions.

Referring again to FIG. 4C, the SiGe film 17 and the SiGe film 18 are lattice-relaxed by the SIMOX (Separation by the Implanted Oxygen) technique at the time of the formation of the buried insulating film 2. Alternatively, an SOI substrate could be previously acquired, and the SiGe film 17 and the SiGe film 18 may be formed on the SOI substrate by epitaxial growth. In that case, the SiGe film 17 and the SiGe film 18 are in a strain state and are lattice-relaxed at the same time, during the oxidation step.

Next, the oxide film 15 and the mask 16 are peeled off by hydrofluoric acid, as shown in FIG. 5B. Then strain-Si films 4 and 40 are epitaxially grown on the lattice-relaxed SiGe films 3 and 30, respectively, by a CVD method or the like. By doing so, the strain-Si films 4 and 40 are applied with different strains corresponding to the lattice constants of the lattice-relaxed SiGe films 3 and 30 respectively.

Next, as shown in FIG. 5C, gate insulating films 6 and 60 are formed on the strain-Si films 4 and 40, and gate electrodes 7 and 70 are formed on the gate insulating films 6 and 60. Additional transistors, such as transistor 101, may be also be formed during the steps of the manufacturing method described above. Wiring lines and connections to voltages $V_{SS}$ 110, $V_{DD}$ 112, and $V_{Boost}$ 111 and to a ground are supplied to form the semiconductor device shown in FIG. 1.

Third Embodiment

Figure 6:
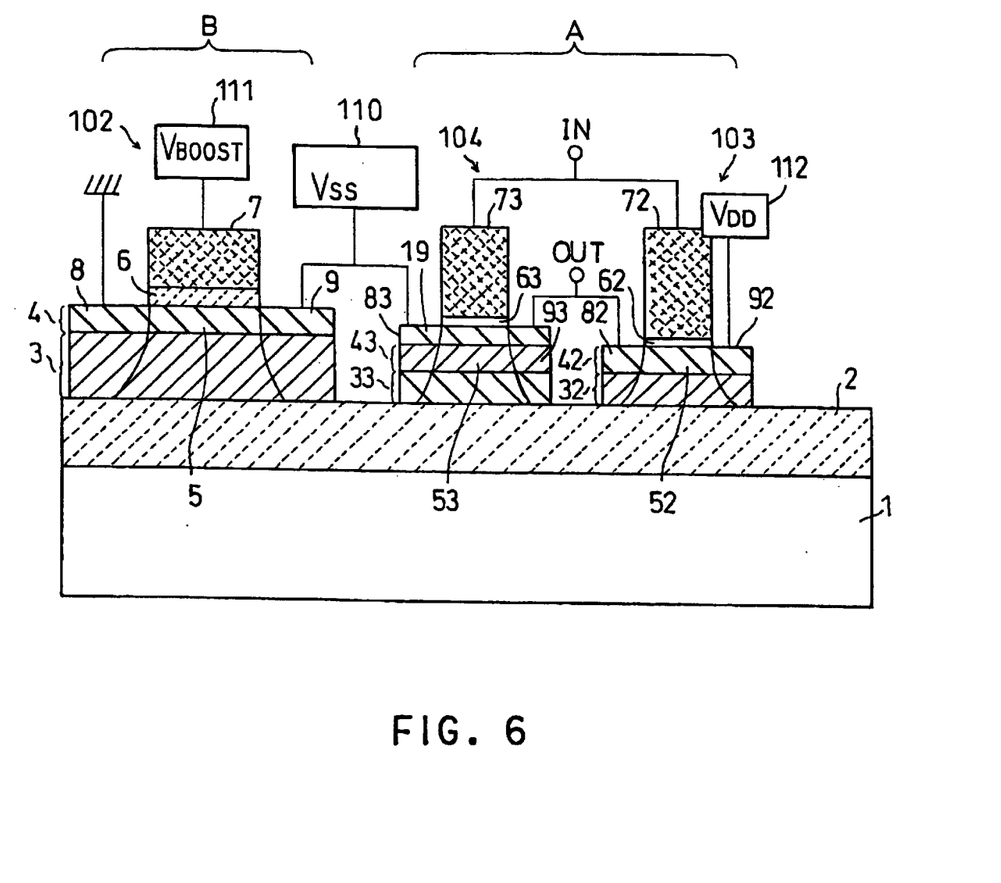
FIG. 6 is a sectional view of a semiconductor device of a third embodiment of the present invention.

FIG. 6 is a sectional view of a semiconductor device of a third embodiment of the present invention comprising a complementary field-effect transistor having a transistor in which a p-channel region is formed in a strain-Si film and a transistor in which an n-channel region is formed in a strain-Si film, and a leak cutting field-effect transistor having a high threshold voltage and connected to the complementary field-effect transistor.

A buried insulating film 2 made of silicon oxide is formed on a silicon substrate 1 having a (001) plane as a principal plane. A high-speed logic portion A comprises a complementary field-effect transistor having an n-type field-effect transistor 103 having a low threshold voltage and a p-type field-effect transistor 104 having a low threshold voltage formed on the buried insulating film 2.

Also, an n-type field-effect transistor 102 having a threshold voltage higher than the n-type field-effect transistor 103 is formed on the buried insulating film 2. A drain region 9 of this n-type field-effect transistor 102 is connected to a source region 83 of the p-type field-effect transistor 104, and is connected to a wiring line. A voltage $V_{SS}$ 110 is applied to the wiring line. The n-type field-effect transistor 102 functions as a leak cut switch portion B which is turned off to prevent a leak current from flowing in a period when the complementary field-effect transistor of the high-speed logic portion A is in an off state. In FIG. 6, a source region 8 of the transistor 102 is grounded, and a power supply voltage $V_{DD}$ 112 is applied to a drain region 92 of the transistor 103. A gate electrode 7 of the leak cutting field-effect transistor 102 is connected to a boost voltage $V_{Boost}$ applying unit 111.

The leak cutting transistor 102 comprises a lattice-relaxed $Si_{0.84}Ge_{0.16}$ film 3 formed on the buried insulating film 2, a strain-Si film 4 formed on the lattice-relaxed SiGe film 3, a gate insulating film 6 comprised of $SiO_2$ formed on the strain-Si film 4, the gate electrode 7 comprised of tungsten formed on the gate insulating film 6, a channel region 5 formed in the strain-Si film 4 under the gate insulating film 6, and the source region 8 and the drain region 9 separately formed in the strain-Si film 4 and provided in a manner that the channel region 5 is positioned between them.

The n-type field-effect transistor 103, which is part of the complementary field-effect transistor, comprises a lattice-relaxed $Si_{0.6}Ge_{0.4}$ film 32 formed on the buried insulating film 2, a strain-Si film 42 formed on the lattice-relaxed SiGe film 32, a gate insulating film 62 comprised of $SiO_2$ formed on the strain-Si film 42, a gate electrode 72 comprised of tungsten formed on the gate insulating film 62, and a channel region 52 formed in the strain-Si film 42 under the gate insulating film 62, and a source region 82 and the drain region 92 separately formed in the strain-Si film 42 and provided in a manner that the channel region 52 is positioned between them.

The p-type field-effect transistor 104, which is part of the complementary field-effect transistor, comprises a silicon film 33 formed on the buried insulating film 2, a strain $Si_{0.8}Ge_{0.2}$ film 43 formed on the Si film 33, a Si cap film 19 formed on this strain $Si_{0.8}Ge_{0.2}$ film 43, a gate insulating film 63 comprised of $SiO_2$ or the like formed on the Si cap film 19 and, a gate electrode 73 comprised of tungsten or the like formed on the gate insulating film 63 and, a channel region 53 formed in the strain SiGe film 43 under the gate insulating film 63, and the source region 83 and a drain region 93 separately formed in the strain SiGe film 43 and provided in a manner that the channel region 53 is positioned between them.

Figure 11:
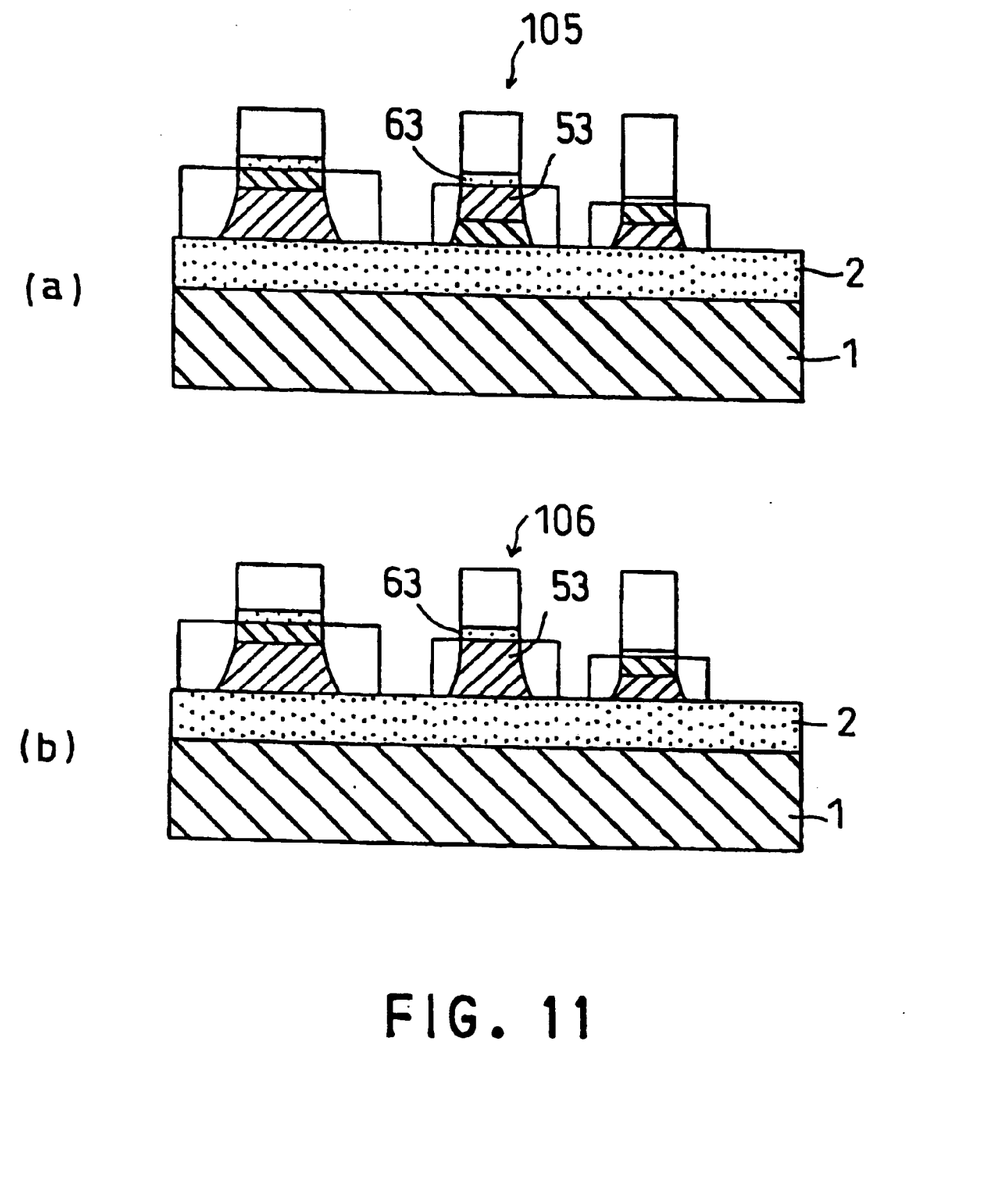
FIGS. 11A and 11B are sectional views of semiconductor devices of modified examples of the present invention.

Alternatively, the p-type field-effect transistor 104 shown in FIG. 6, may be replaced with transistor 105 shown in FIG. 11A in which the strain SiGe film 53 is in direct contact with the gate insulating film 63. Also, the p-type field-effect transistor 104 shown in FIG. 6, may be replaced with transistor 106 shown in FIG. 11B in which the strain SiGe film 53 is directly sandwiched between the gate insulating film 63 and the buried insulating film 2.

In FIG. 6, voltages $V_{SS}$ 110 and $V_{DD}$ 112 are $0 \leq V_{SS} \leq V_{DD} \leq V_{Boost}$. The thickness of the lattice-relaxed SiGe film 3 is 50 nm, and the of the lattice-relaxed SiGe film 32 is 10 nm. The thickness of each of the strain-Si films 4 and 42 is 5 nm. N-type impurities are diffused in the source regions 8 and 82 and the drain regions 9 and 92 of the leak cutting field-effect transistor 102 and the n-type field-effect transistor 103. The diffusion range includes not only the strain-Si films 4 and 42 but also the lattice-relaxed SiGe films 3 and 32.

In the semiconductor device shown in FIG. 6, the Ge concentration in the lattice-relaxed SiGe film 3 of the leak cutting field-effect transistor 102 is lower than the Ge concentration of the lattice-relaxed SiGe film 32 of the transistor 103. Accordingly, the strain amount of the strain-Si film 4 is smaller than that of the strain-Si film 42. In this case, the threshold voltage the threshold voltage of the leak cutting transistor 102 is higher than that of the transistor 103.

Also, in the complete depletion-mode SOI MOSFET, the transistor 103, which has a low threshold voltage, is minute, and can perform high speed operations, but has a large off current, is used in the principal CMOS logic circuit portion A. Transistor 102, on the other hand, has a high threshold voltage, is excellent in the cut off characteristic and, can be used as the leak cutting transistor.

In the p-type field-effect transistor 104, of this embodiment, the hole channel is formed mainly in the interface between the strain SiGe film 43 and the Si cap film 19. The transistor 104 is used as the p-channel MOSFET to obtain the conformity of threshold voltage to the n-channel transistor 103 similarly to the case where the Ge composition of the p-channel is increased in the modified example of the semiconductor device of the first embodiment.

Figure 7:
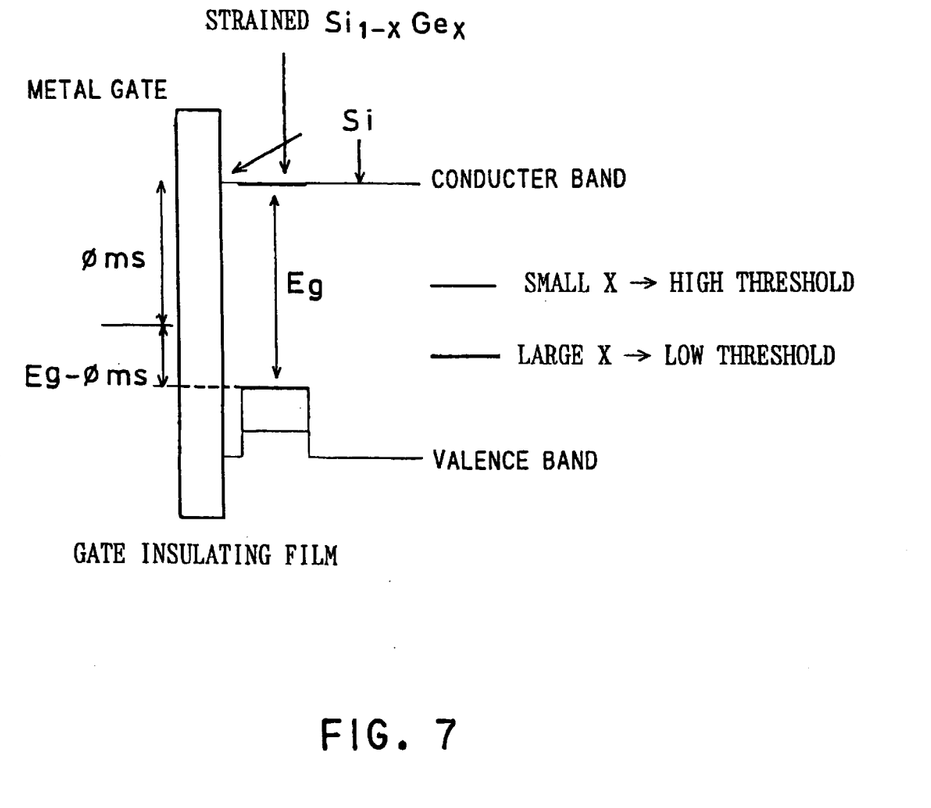
FIG. 7 is a band diagram of a channel region in a MOSFET of the semiconductor device of a third embodiment of the present invention.

FIG. 7 is a band diagram of the p-channel portion of the transistor 104 used as the p-channel MOSFET in the CMOS of this embodiment.

As shown in FIG. 7, in the strain SiGe MOSFET 104, when the Ge composition of the channel 43 is increased, Eg-φms is decreased, so that the absolute value of the threshold voltage is decreased. Here, Eg is a band gap of the strain SiGe, and φms is a difference between the work function of the gate electrode 73 and the electron affinity of the strain SiGe. Since the dependency of the threshold voltage on the Ge composition (or strain amount) in the SiGe film is larger than that of the p-channel MOSFET 104 comprised of strain Si, a greater range of adjustment in the threshold voltage can be obtained.

Next, a method of manufacturing the semiconductor device shown in FIG. 6 will be described by use of FIGS. 9A to 10C.

First, as shown in FIG. 9A, there is prepared a SOI substrate comprising a buried insulating layer 2 comprised of $SiO_2$ formed on a silicon substrate 1, and a silicon layer 21 formed thereon and having a thickness of 20 nm. A mask 20 comprised of $Si_3N_4$ is formed in a region on the SOI substrate where a pMOSFET is to be formed.

Next, as shown in FIG. 9B, a $Si_{0.9}Ge_{0.1}$ film 22 with a thickness of 80 nm and having lattice strain is grown on the whole surface of the substrate using an epitaxial growth method such as a CVD method or an MBE method. A polycrystalline $Si_{0.9}Ge_{0.1}$ film 123 having a thickness of 80 nm is formed on the mask 20.

Next, as shown in FIG. 9C, the polycrystalline SiGe film 123 formed on the mask 20 is peeled off. Then, a part of the substrate is protected by another mask, and the $Si_{0.9}Ge_{0.1}$ film of the region where the CMOS is to be formed is thinned by chemical dry etching. In this way, the thin $Si_{0.9}Ge_{0.1}$ film 23 having a thickness of 40 nm is formed in the CMOS formation region, and the thick $Si_{0.9}Ge_{0.1}$ film 22 having a thickness of 80 nm is formed in a leak cutting transistor formation region. Further, the formation regions of the leak cutting transistor 102, p-channel MOSFET 104 and n-channel MOSFET 103 are respectively separated by forming grooves by a photolithography step. By these steps, the thick SiGe film 22 and the thin SiGe film 23 having different thicknesses are formed on the insulating film 2.

Next, the structure shown in FIG. 9C is subjected to a dry thermal oxidation treatment at 1100° C. By this oxidation step, the thick SiGe film 22 and the thin SiGe film 23 are oxidized from the surfaces, so that an $SiO_2$ film 15 is formed over the SiGe films 22 and 23. Then, Si atoms in the thick SiGe film 22 and the thin SiGe film 23 bond to oxygen atoms, while Ge atoms are expelled from the oxide films and stored in remaining portions of the first SiGe film 22 and the second SiGe film 23.

Since the buried insulating film 2 prevents Ge atoms from diffusing into the silicon substrate 1, as the oxidation proceeds the Ge compositions in the first SiGe film 22 and the second SiGe film 23 become large. In addition, the interface between the buried insulating film 2 and the SiGe films 22 and 23 becomes weak at temperatures of 1000° C. or higher. Accordingly, lattice relaxation proceeds, so that a thick first lattice-relaxed SiGe film 3 having thickness of 50 nm and a thin second lattice-relaxed SiGe film 32 having thickness of 10 nm can be formed.

In this way, as shown in FIG. 9D, the first lattice-relaxed $Si_{0.84}Ge_{0.16}$ film 3 and the second lattice-relaxed $Si_{0.6}Ge_{0.4}$ film 32 having different Ge compositions are formed on the insulating film 2.

Next, as shown in FIG. 10A, the oxide film 15 formed in FIG. 9D is peeled off by hydrofluoric acid, and strain-Si films 4 and 42 are epitaxially grown on the first lattice-relaxed SiGe film 3 and the second lattice-relaxed SiGe film 32 by a CVD method or the like. By doing so, the strain-Si films 4 and 40 are applied with different strains corresponding to lattice constants of the first lattice-relaxed SiGe films 3 and 30. At this time, a polycrystalline silicon film 24 is formed on the mask 20.

Next, as shown in FIG. 10B, portions other than the p-channel MOSFET formation region are covered with CVD oxide films 25, and after the polycrystalline silicon film 24 and the mask 20 are removed, a strain SiGe film 43 and a Si cap film 19 are successively selectively formed by epitaxial growth.

Next, as shown in FIG. 10C, the CVD oxide films 25 (FIG. 10B) are peeled off, gate insulating films 6, 62 and 63 are formed on the strain-Si films 4 and 42 and the Si cap film 19 and gate electrodes 7, 72 and 73 are formed on the gate insulating films 6, 62 and 63. As stated above, the transistors are formed by the normal CMOS formation process and wiring lines are formed. Wiring lines and connections to voltages $V_{SS}$ 110, $V_{DD}$ 112, and $V_{Boost}$ 111 and to a ground are supplied to form the semiconductor device shown in FIG. 1.

The present invention is not limited to the respective embodiments described, but can also be applied to other multi-threshold logic circuits. Furthermore, the present invention can be applied to not only digital logic circuits but also a digital and analog mixed LSI. In this case, since an effective voltage amplitude can be made large by constituting an analog circuit by a transistor having a lower threshold voltage, the S/N ratio can be made high.

As described above, according to the present invention, it becomes possible to integrate complete depletion-mode field-effect transistors having different threshold voltages on one LSI chip. As a result, an LSI with high speed and low consumed electric power can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first lattice-relaxed $Si_{1-x}Ge_x$ film formed on a first region on an insulating film, wherein a Ge composition x is in a range of 0 to 1;
   a second lattice-relaxed SiGe film having a Ge composition greater than the first lattice-relaxed $Si_{1-x}Ge_x$ film, wherein the second lattice-relaxed SiGe film is formed on a second region on the insulating film;
   a first strain-Si film formed on the first lattice-relaxed $Si_{1-x}Ge_x$ film;
   a second strain-Si film formed on the second lattice-relaxed SiGe film;
   a complete depletion-mode first field-effect transistor including the first strain-Si film as a channel; and
   a complete depletion-mode second field-effect transistor including the second strain-Si film as a channel, threshold value of the second field-effect transistor is different from threshold value of the first field-effect transistor.

2. A semiconductor device according to claim 1, further comprising a CMOS circuit in which a plurality of the second field-effect transistors are combined.

3. A semiconductor device according to claim 1, wherein the Ge composition x of the first lattice-relaxed $Si_{1-x}Ge_x$ film is 0, and the Ge composition of the second lattice-relaxed SiGe film is 12 atomic % or higher.

4. A semiconductor device according to claim 1, wherein a difference between the Ge composition of the first lattice-relaxed $Si_{1-x}Ge_x$ film and the Ge composition of the second lattice-relaxed SiGe film is 12 atomic % or more.

5. A semiconductor device according to claim 1, wherein a difference between the Ge composition of the first lattice-relaxed $Si_{1-x}Ge_x$ film and the Ge composition of the second lattice-relaxed SiGe film is 12 atomic % or more, and the Ge composition of the second lattice-relaxed SiGe film is 25 atomic % or higher.

6. A semiconductor device according to claim 1, wherein the second lattice-relaxed SiGe film is thinner than the first lattice-relaxed $Si_{1-x}Ge_x$ film.

7. A semiconductor device comprising:

a substrate;

an insulating film;

a first field-effect transistor including a first lattice-relaxed $Si_{1-x}Ge_x$ film having a Ge composition x in a range of 0 to 1 and formed in a first region on the insulating film, a first strain-Si film formed on the first lattice-relaxed $Si_{1-x}Ge_x$ film, a first gate insulating film formed on the first strain-Si film, a first gate electrode formed on the first gate insulating film, and a first source region and a first drain region separately formed in the first strain-Si film; and a second field-effect transistor including a second lattice-relaxed SiGe film formed in a second region on the insulating film, a second strain-Si film formed on the second lattice-relaxed SiGe film, a second gate insulating film formed on the second strain-Si film, a second gate electrode formed on the second gate insulating film, and a second source region and a second drain region separately formed in the second strain-Si film, wherein a threshold voltage of the second field-effect transistor is different from a threshold voltage of the first field-effect transistor.

8. A semiconductor device according to claim 7, wherein a Ge composition of the second lattice-relaxed SiGe film is higher than the Ge composition of the first lattice-relaxed SiGe film.

9. A semiconductor device according to claim 7, wherein the Ge composition x of the first lattice-relaxed $Si_{1-x}Ge_x$ film is 0, and a Ge composition of the second lattice-relaxed SiGe film is 12 atomic % or higher.

10. A semiconductor device according to claim 7, wherein a difference between the Ge composition of the first lattice-relaxed $Si_{1-x}Ge_x$ film and a Ge composition of the second lattice-relaxed SiGe film is 12 atomic % or more.

11. A semiconductor device according to claim 7, wherein a difference between the Ge composition of the first lattice-relaxed $Si_{1-x}Ge_x$ film and a Ge composition of the second lattice-relaxed SiGe film is 12 atomic % or more, and the Ge composition of the second lattice-relaxed SiGe film is 25 atomic % or higher.

12. A semiconductor device according to claim 7, wherein the second lattice-relaxed SiGe film is thinner than the first lattice-relaxed $Si_{1-x}Ge_x$ film.

13. A semiconductor device according to claim 7, wherein the first field-effect transistor and the second field-effect transistor are n-type field-effect transistors.

14. A semiconductor device according to claim 7, further comprising a CMOS circuit in which a plurality of the first field-effect transistors or a plurality of the second field-effect transistors are combined.

15. A semiconductor device according to claim 14, further comprising a complementary field-effect transistor which includes a strain-SiGe film formed in a third region on the insulating film, a third gate insulating film formed on the strain-SiGe film, a third gate electrode formed on the third gate insulating film, and a third source region and a third drain region separately formed in the strain-SiGe film and provided in a manner that a channel region is positioned between them.

16. A semiconductor device according to claim 14, further comprising a complementary field-effect transistor which includes a strain-SiGe film formed on the insulating film, a Si film formed on the strain-SiGe film, a third gate insulating film formed on the Si film, a third gate electrode formed on the third gate insulating film, and a third source region and a third drain region separately formed in the Si film and provided in a manner that a channel region is positioned between them.

* * * * *